United States Patent [19]
Adam et al.

[11] 3,939,364
[45] Feb. 17, 1976

[54] DELAY LINE FOR ANALOGOUS SIGNALS

[75] Inventors: Fritz Guenter Adam; Hermannus Schat, both of Freiburg, Germany

[73] Assignee: ITT Industries, Inc., New York, N.Y.

[22] Filed: Nov. 12, 1974

[21] Appl. No.: 523,187

[30] Foreign Application Priority Data
Nov. 21, 1973   Germany............................ 2357982

[52] U.S. Cl.............................. 307/221 C; 307/251
[51] Int. Cl.² ........................................ H03K 21/00
[58] Field of Search...................... 307/221 C, 221 D

[56] References Cited
UNITED STATES PATENTS

3,746,883   7/1973   Kovac............................ 307/221 D
3,819,953   6/1974   Puckette et al................. 307/221 D
3,838,293   9/1974   Shah.............................. 307/221 D

OTHER PUBLICATIONS

"Noise Compensator for Charge–Coupled Devices" by Chai et al., IBM Tech. Discl. Bull. Vol. 16 No. 4 Sept. 73 pp. 1099, 1100.

*Primary Examiner*—Harold A. Dixon
*Attorney, Agent, or Firm*—John T. O'Halloran; Menotti J. Lombardi, Jr.; Vincent Ingrassia

[57] ABSTRACT

This relates to a bucket-brigade delay line wherein clock frequency dependent modulation of the delayed signal is avoided by inserting at least one inverter stage into the delay line. The output of the inverter stage contains the inverted modulation signal. This signal is then added to the line thereby compensating for the unwanted modulation.

9 Claims, 6 Drawing Figures

DELAY LINE FOR ANALOGOUS SIGNALS

BACKGROUND OF THE INVENTION

This invention relates to a bucket-brigade delay line and more particularly deals with the problem which arises when delay lines for analogous signals composed of individual stages in accordance with the bucket-brigade delay line or the charge-coupled delay line principle are operated at a variable clock frequency.

Bucket brigade delay lines are known, for example, from "IEEE Journal of Solid-State Circuits," June 1969, pp. 131 to 136 and consist of a plurality of stages of the same kind each comprising a transistor and a capacitor arranged between the gate and the collector electrode thereof, and which are series-connected in such a way that the collector electrode of one transistor is connected to the emitter electrode of the next successive transistor. In such arrangements the gates of the even-numbered transistors are controlled by a first square-wave clock signal, and the gates of the odd-numbered transistors are controlled by a second square-wave clock signal of equal frequency, with the effective pulses thereof lying in the intervals between the effective pulses of the first clock signal.

Bucket brigade delay lines can be realized either with the aid of bipolar monolithic integrated circuits or with the aid of monolithic integrated insulated-gate field-effect transistor circuits.

Delay lines operating on the charge-coupled principle are known, for example, from the "Bell System Technical Journal," April 1970, pp. 587 to 600. The difference between bucket brigade delay lines and delay lines operating on the charge-coupled principle resides in that the diffusion zones existing in bucket-brigade delay lines, the capacitors and the emitter and collector zones are omitted. The delay line thus exclusively consists of closely adjacent channel zones controlled by the gate electrodes, which are coupled to one another by overlapping of the potential wells. Both the charge transfer and the charge storage are taken over exclusively by minority carriers.

In the course of this the semiconductor suface below the electrodes is in the so-called deep depletion mode. By means of a third clock signal, care is taken that potential barriers will result between three neighboring electrodes in the semiconductor body for taking over the charge storage as effected in the capacitors in the case of bucket-brigade circuits.

The problem referred to hereinbefore, as arising in such types of delay lines, resides in that during operation at a variable clock frequency, an unwanted component of that particular frequency will appear in the delayed analog output signal, by which the clock frequency is changed, hence modulated. This unwanted modulation is due to a clock frequency dependent modulation for which there may be a variety of causes depending on the operating conditions.

Thus, this unwanted modulation may result in cases where the phase position of the clock signals is dependent upon the clock frequency and where simultaneously there occurs an overlapping of the edges of the pulses or an overshooting of the clock signals. By providing for an exact clock signal treatment it is possible, however, to avoid this cause to a considerable extent even though not completely.

Secondly, the clock frequency dependent residual charge remaining in the capacitor of each stage subsequently to the charge reversal thereof, is considered as a further unavoidable cause of unwanted modulations, especially in the case of higher clock frequencies.

Thirdly, in the case of lower clock frequencies and higher temperatures, it is likewise unavoidable that an unwanted modulation becomes noticeable by the drifting of the d.c. level from stage to stage owing to a charge transfer via inverse currents. Fourthly and finally, in the case of delay lines which have been realized with the aid of monolithic integrated insulated-gate field-effect transistors, hence with the aid of the so-called MOS-technique, surface states below the oxide layer of the gate electrode of the transistors, because thay are charged during their turn-on phase and more or less completely discharged during their turn-off phase, lead to cumulative (i.e., number-of-stage-dependent) level drift which is dependent upon the frequency and which takes place in a direction opposite to that of the aforementioned inverse current dependent drift.

From the "IEEE Journal of Solid-State Circuits," April 1973, pp. 157 to 168, especially page 157, FIG. 2, it is known to solve the problem of compensating such unwanted modulations, in that a second delay line with an equal number of stages is connected in parallel with the delay line subjected to the unwanted modulation, with the signal each time being inverted before the input and after the output of one of the two lines, with the compensated signal finally being obtained by way of addition.

This solution to the aforementioned problem, however, is very costly and thus also involves a great surface requirement of the corresponding integrated circuit.

SUMMARY OF THE INVENTION

It is an object of the present invention to provide a delay line of the bucket-brigade or the drange-coupled type which solves the above mentioned problem by simultaneously reducing the circuit investment. According to a broad aspect of the invention, there is provided a delay line of the type wherein a plurality of stages are coupled together, said delay line having an input to which there is applied a d.c. potential and a signal to be delayed and wherein clock signals are applied to said stages, comprising: at least one inverter stage coupled between two adjacent stages of said plurality of stages for inverting the signal potential and thereby reducing unwanted modulations with respect to said d.c. input potential.

The above and other objects of the present invention will be more clearly understood from the following detailed description taken in conjunction with the accompanying drawings, in which:

DESCRIPTION OF THE PREFERRED EMBODIMENT

Figure 1:
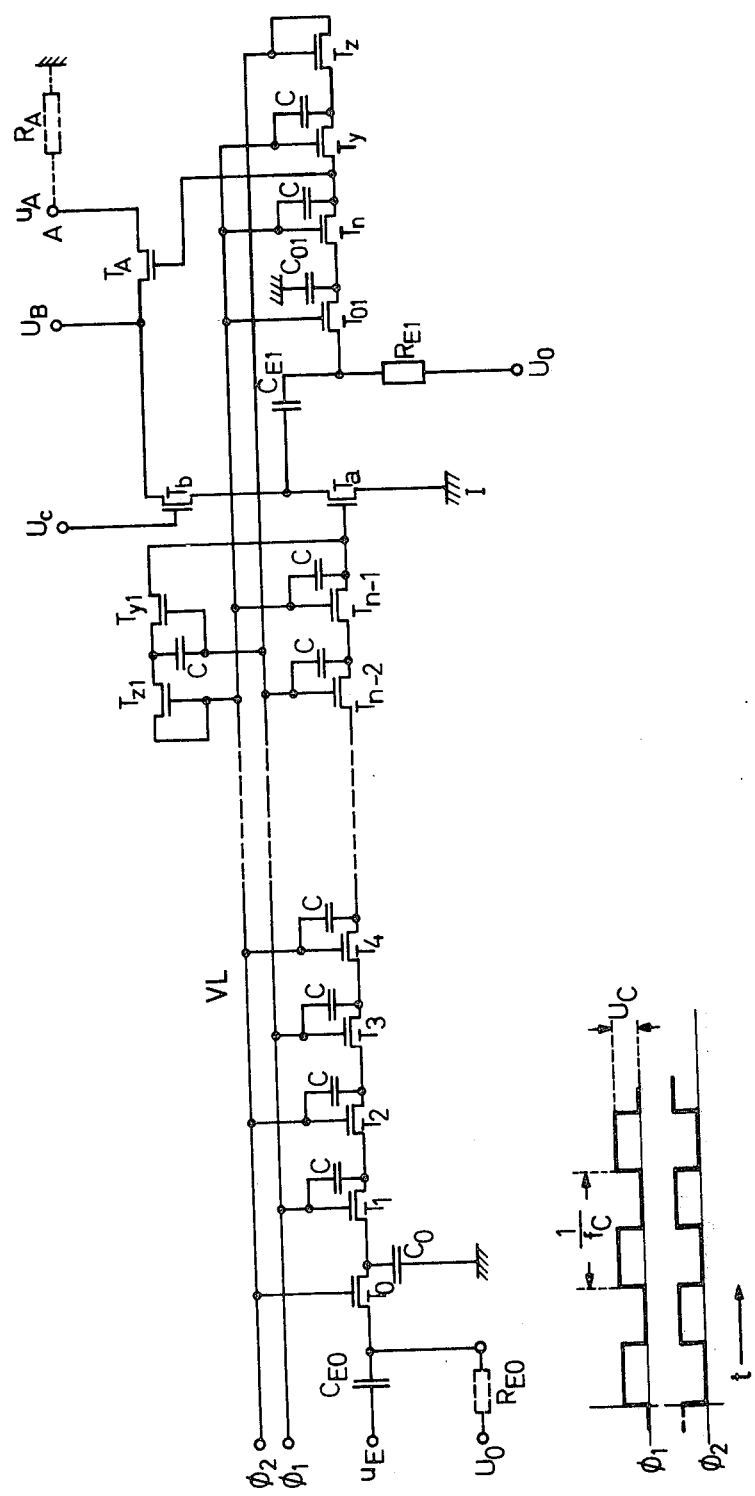
FIG. 1 shows a first embodiment of the invention with reference to a bucket brigade delay line realized with the aid of MOS-transistors.

By using the example of embodiment of the invention shown in FIG. 1, it is possible to eliminate the first two of the above-mentioned sources of the trouble, as they are independent of the number of stages of the delay line, i.e., non-cumulative and equally large in each stage. According to the invention, therefore, it is possible to compensate for these two unwanted modulations at any arbitrary point within the delay line, so that the separate preparation of a correcting signal for compensating the unwanted modulations would become superfluous, because the inverted unwanted modulation itself is added to the unwanted modulation newly originating behind the inverter stage, and would thus lead to a compensation of the unwanted modulation independently of its functional relationship to the clock frequency.

As an example of embodiment there is shown in FIG. 1 a delay line VL which is based on the bucket-brigade principle. Of the $n$ delaying stages there are shown in the drawing the stages 0, 1, 2, 3, 4, $n-2$, $n-1$ and $n$ together with the transistors $T_0$, $T_1$, $T_2$, $T_3$, $T_4$, $T_{n-2}$, $T_{n-1}$, $T_n$, $T_y$ and $T_z$. The transistors $T_y$, $T_z$ serve to terminate the line VL. The delayed signal is taken off the line between the transistors $T_n$ and $T_y$, and fed to the gate terminal of the impedance transformer $T_A$. $R_A$ indicates the load resistance thereof. The output signal $u_A$ is taken off at the output A. The capacitors C belonging to the transistors $T_1$ to $T_n$ and to $T_y$ are each connected between the gate terminal and the collector electrode of the transistors. The clock signal $\phi_1$ is applied to the gates of the odd-numbered transistors, and the clock signal $\phi_2$ is applied to the gates of the even-numbered transistors.

To the emitter electrode of transistor $T_0$ there is applied on one hand, via the input capacitor $C_{E0}$, the input signal $u_E$ to be delayed and, on the other hand, if necessary across the resistor $R_{E0}$, there is applied the input d.c. potential $U_0$. The capacitor $C_0$ belonging to the transistor $T_0$ is arranged between its collector electrode and the zero point of the circuit.

The collector electrode of the last transistor $T_z$ of the delay line VL is connected to its gate, thus forming the d.c. voltage termination of the delay line.

The curve as a function of time of the two clock signals $\phi_1$, $\phi_2$ is schematically shown in the left-hand bottom part of FIG. 1. As already mentioned hereinbefore, the clock signals are of the squarewave or rectangular type, with the effective pulses of the one lying in the intervals between the effective pulses of the other clock signal. The amplitude of the clock signals is indicated by the reference $U_C$, and the frequency is indicated by the reference $f_C$.

According to the invention, the delay line VL is now separated between the transistors $T_{n-1}$ and $T_n$, with the inverter stage I being inserted at this separating point. It consists of the amplifier transistor $T_a$ and of the transistor $T_b$ serving as the operating resistor and which, with its controlled current path, is connected in series with the controlled current path of transistor $T_a$. The load transistor $T_b$ and, consequently, the entire converter is supplied with supply voltage $U_B$ while the d.c. voltage $U_c$ is connected to the gate of the load transistor. If necessary, the gain factor of the inverter I may be influenced via this d.c. voltage.

To the connecting point between the collector electrode of transistor $T_{n-1}$ and the inverter input there are connected the two bucket brigade terminating stages $T_{y1}$ and $T_{z1}$ which are connected in the same way as the terminating transistors $T_y$ and $T_z$ at the output of the whole line. The transistors $T_{y1}$ and $T_{z1}$ serve to effect the termination of the line section lying ahead of the separating point, hence of the inverter stage I, with respect to direct current.

Moreover, a normal bucket-brigade input stage is connected between the inverter output, hence the collector of transistor $T_a$, and the trnasistor $T_n$. This input stage consists of the series connection of the capacitor $C_{E1}$ and the controlled current path of transistor $T_{01}$, to the common connecting point of which the input d.c. potential $U_0$ is applied across a very high ohmic resistor $R_{E1}$ (in the order of some megohms). The connecting point between the transistors $T_{01}$ and $T_n$ is applied via the capacitor $C_{01}$ to the zero point of the circuit, or to any other fixed potential.

The time constant $R_{E1}C_{E1}$ must be greater than the period required for one cycle of the disturbing frequency with which the clock frequency is modulated. The value of $C_{E1}$ will therefore have to amount to some nanofarads or more. Therefore, as a rule, $C_{E1}$ cannot be integrated as well; the terminals for $C_{E1}$, therefore, are led to the outside.

The transistors $T_y$ and $T_{y1}$ are connected in the same way as normal bucket brigade stages, i.e., the gate is connected to that of the clock line which is also connected to the gate of the second preceding transistor. The gate of transistor $T_y$ is thus applied together with that of transistor $T_{01}$ to the clock signal $\phi_2$, while that of transistor $T_{y1}$ together with that of transistor $T_{n-2}$ is applied to the clock signal $\phi_1$.

The gates of transistors $T_y$, $T_{y1}$ are moreover still connected each via a capacitance C, to the point connecting the transistors $T_y$ or $T_{y1}$ and $T_z$ or $T_{z1}$ respectively. The gates of transistors $T_z$, $T_{z1}$ are each connected to the other clock signal and are directly connected to the collector electrode of transistor $T_z$ or $T_{z1}$. Accordingly, transistor $T_z$ is controlled by the clock signal $\phi_1$ and transistor $T_{z1}$ is controlled by the clock signal $\phi_2$.

The output signal is taken off between $T_n$ and $T_y$. Therefore, the connecting point between $T_n$ and $T_y$ is connected to the gate of transistor $T_A$ whose collector electrode is connected to the source of supply voltage $U_B$, and whose emitter electrode A is connected to the zero point of the circuit across the load resistor $R_A$. $T_A$ and $R_A$ represent an impedance transformer hence, in the case of bipolar transistors, an emitter follower. The delayed signal is obtained at the output A.

In the presence of unwanted modulations of the aforementioned first and second kind only, the inverter stage may also be arranged between any two other kinds of delaying stages.

In the presence of unwanted modulations of the aforementioned third and fourth kind, however, inversion or mirror-inversion is best carried out in the center of the line between the stages $T_{n/2}$ and $T_{n/2+1}$, in which case $n$ is supposed to be even-numbered. Incidentally, the unwanted modulation increases from stage to stage, hence in cumulative, and reaches in the middle of the line half the output value. By providing for an inversion in the center (middle), the unwanted modulation is compensated just at the output when the unwanted modulation of each stage increases by the same amount, i.e., along the line in a linear fashion. This linearity, under certain circumstances, is not always fulfilled, for which reason it is appropriate for the gain factor of the inverter to be variable; this may be realized by means of the voltage $U_c$ as applied to the gate of the load transistor $T_b$. In this way it is possible to equalize any eventually existing asymmetry between the front and the rear half of the line with respect to inverse currents or the surface states.

Figure 2:
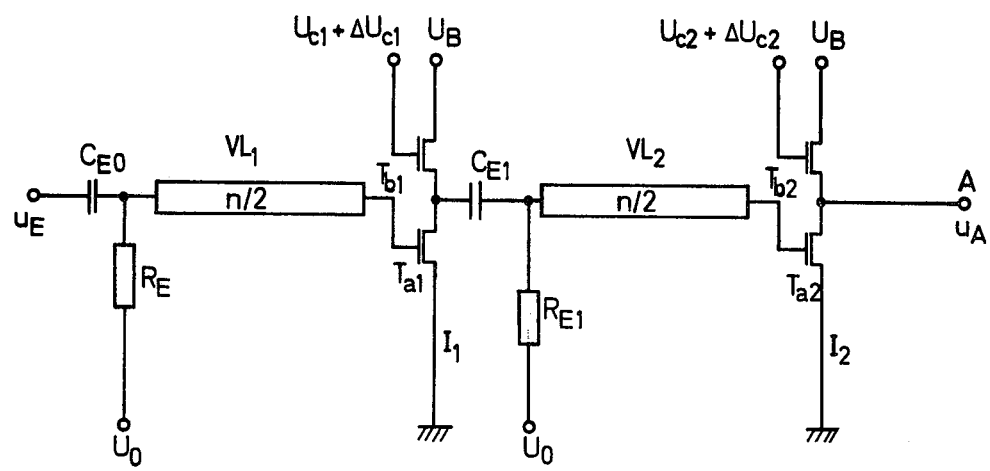
FIG. 2, in a more schematical representation, shows a further development of the embodiment according to FIG. 1.

FIG. 2, as an example relating to this type of embodiment of the invention, shows a delay line which is divided into the two halves $VL_1$ and $VL_2$. The actual delay line, however, is only shown schematically by way of the two blocks $n/2$. The inverter $I_1$ is arranged between the two line halves $VL_1$ and $VL_2$. This inverter $I_1$ consists of the transistors $T_{a1}$ and $T_{b1}$. The gate of the load transistor $T_b$ is supplied with the voltage $U_{c1} + \Delta U_{c1}$, with the unbalance being compensated by the component $\Delta U_{c1}$. The rear part $n/2$ of the line is again connected via the RC circuit $R_{E1}$, $C_{E1}$, to the inverter $I_1$, with the series transistor $T_{01}$ together with the capacitor $C_{01}$ according to FIG. 1 not being shown, but existing in the circuit.

In the embodiment according to FIG. 2 there is provided instead of the impedance transformer stage including the transistor $T_A$ according to FIG. 1, a further inverter $I_2$ serving as an amplifier, including the transistors $T_{a2}$ and $T_{b2}$. The gate of the load transistor $T_{b2}$ is being fed with the d.c. voltage $U_{c2} + \Delta U_{c2}$, so that via the thus effected gain factor control, it is possible to achieve a desired amplification of the delayed output signal $u_A$. At the separating point the front part $n/2$ of the line is terminated by transistors corresponding to the transistors $T_{y1}$, $T_{z1}$ according to FIG. 1 which, however, is not explicitly shown in the drawing.

Figure 3:
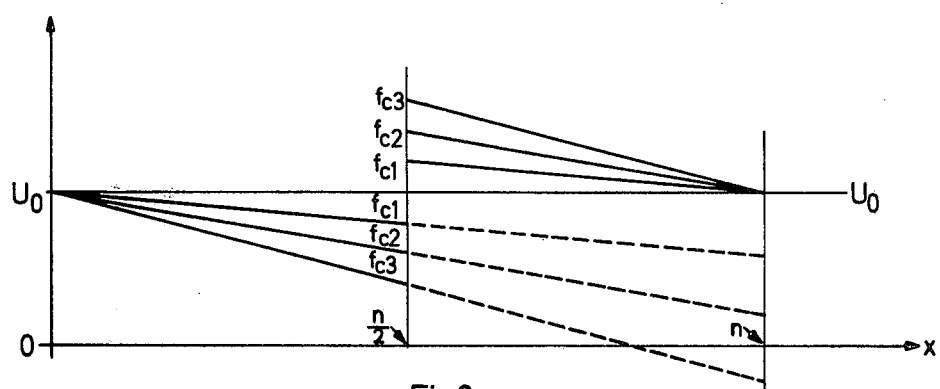
FIG. 3 shows a potential diagram relating to the arrangement according to FIG. 2 and to the case of a symmetrical type of unwanted modulation.

FIG. 3, in the form of a potential level diagram, shows the compensation of the aforementioned symmetrical unwanted modulations in the case of the three different clock frequencies $f_{C1}$, $f_{C2}$ and $f_{C3}$. As may be taken from this FIG. 3, an oppositely directed deviation is produced at the separating point after $n/2$ stages from a negatively directed unwanted modulation which is increased by the same amount and which, after $n$ stages, again returns the unwanted modulation to the output level $U_0$.

Figure 4:
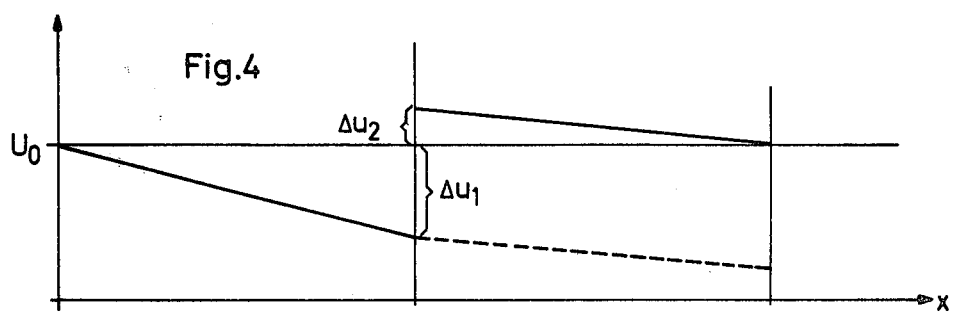
FIG. 4 shows a potential diagram relating to the arrangement according to FIG. 2 and to the case of an asymmetrical type of unwanted modulation.

FIG. 4 shows a further level diagram, i.e., with respect to the case of an asymmetrical unwanted modulation. In this particular case, and with the aid of the voltage component $\Delta U_{c1}$, the gain factor of the inverter $I_1$ is to be adjusted to the quotient of the two deviations $\Delta u_2 / \Delta u_1$.

Figure 5:
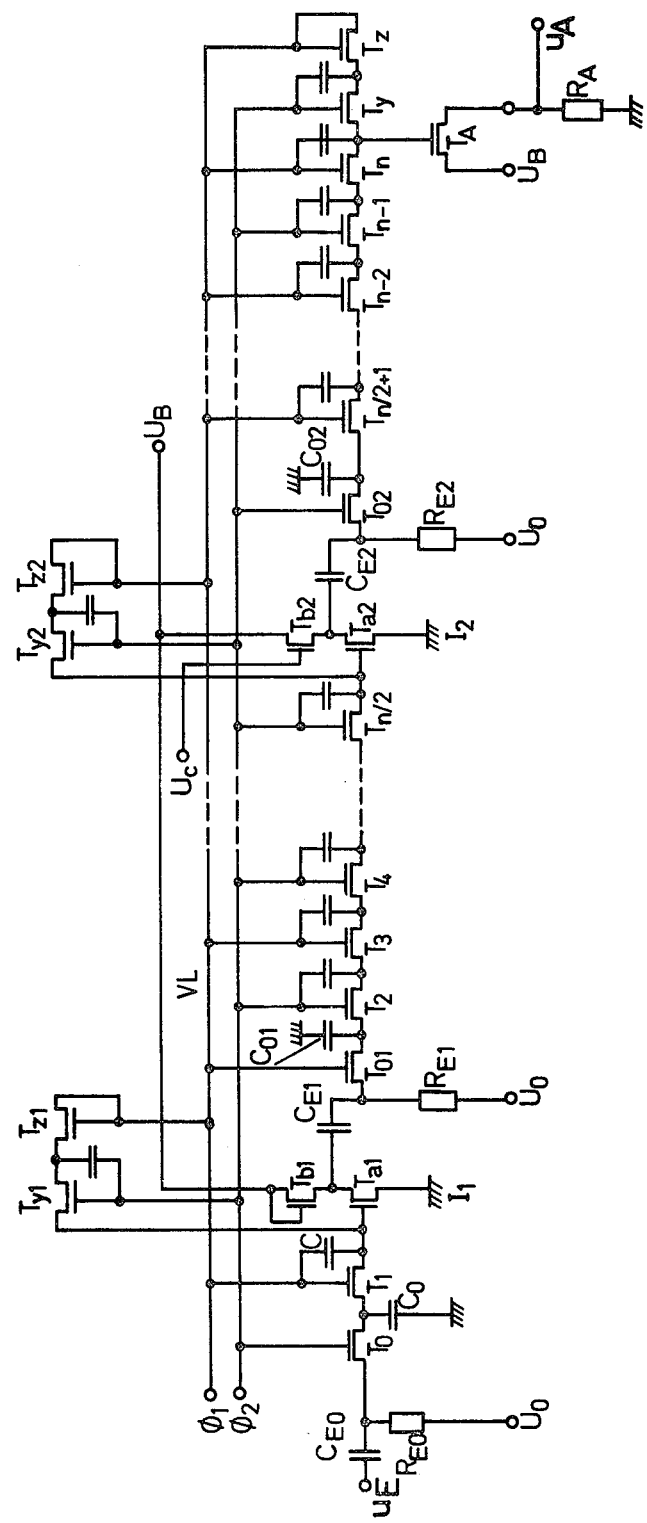
FIG. 5 shows a further example of embodiment of the invention.

In cases where the unwanted modulation, unlike in the former assumptions, is composed of a non-cumulative and of a cumulative component with different frequency dependencies, the previously proposed steps and measures to be taken will no longer be sufficient in the individual case. This problem may be solved by carrying out the inversion in accordance with the embodiment shown in FIG. 5, first at the beginning of the line where the cumulative unwanted modulation is still negligible, hence as shown e.g., in FIG. 5, between the first and the second delaying stage. Accordingly, the inverter $I_1$ and the line input circuit including $C_{E1}$, $R_{E1}$, $T_{01}$ and $C_{01}$ are inserted at this point, hence between the transistors $T_1$ and $T_2$, and there is also provided the line termination of the front part including the transistors $T_{y1}$, $T_{z1}$.

The inverter stage $I_1$ serves to compensate the non-cumulative component. The remaining cumulative component, as in the example of embodiment according to FIG. 2, is compensated almost in the center of the line, hence between the stages $T_{n/2}$ and $T_{n/2+1}$, in which case, if so required, at an existing unbalance of the line halves, also the cumulative unwanted modulation can be completely eliminated with the aid of the gain factor adjustment by means of the control voltage $U_c$. The inverter stage $I_2$ consists of the transistors $T_{a2}$, $T_{b2}$, with the output signal thereof, via the RC-circuit $R_{E2}$, $C_{E2}$, being fed to the transistor $T_{02}$ with the capacitor $C_{02}$, as preceding the transistor $T_{n/2+1}$. The center part of the line is terminated by the transistors $T_{y2}$, $T_{z2}$.

In the case of longer delay lines and a relatively great cumulative unwanted modulation, the latter cannot be removed by employing a single inversion in the center of the line, especially not in cases where the unwanted modulation is comparable to or greater than the modulation shift of the line. In such cases it might help to carry out the inversion twice or several times. In the case of employing the inversion $k$ times, not counting the inversion carried out after the first stage and which is intended to eliminate the non-cumulative component, and in the case of a delay line comprising $n$ stages, the first inverter stage is to be inserted following the stage $n/2k$, with the remaining $k-1$ inverter stages each being inserted at a spacing of $n/k$ stages. The gain factor adjustment, as a rule, only needs to be carried out at the last inverter stage in order to remove any eventual residual unwanted modulation which might be due to an unequal distribution of the unwanted modulation along the line.

Figure 6:
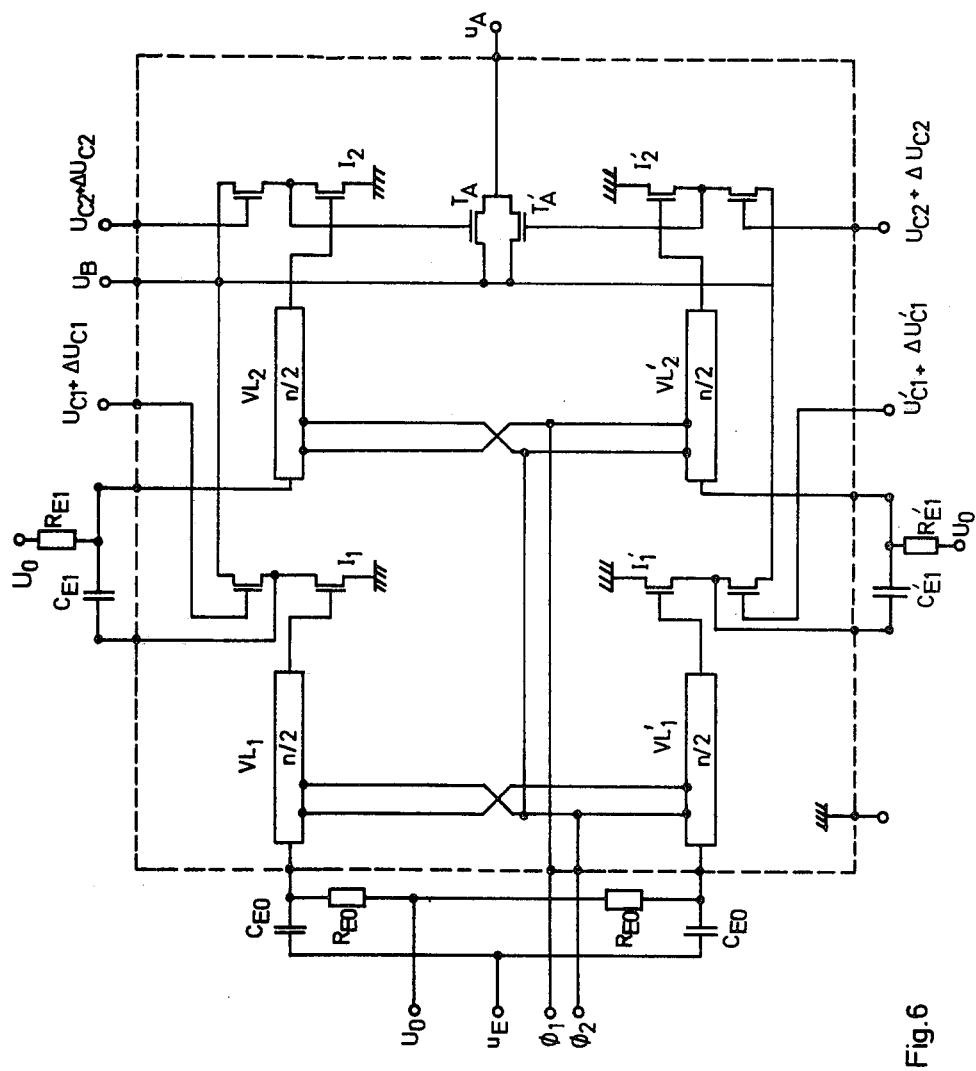
FIG. 6 shows a so-called duplex line based on the principle shown in FIG. 2.

FIG. 6 shows the example of embodiment according to FIG. 2 as applied to a so-called duplex delay line. With the aid of a duplex delay line it is possible, by maintaining the same delay time and the same clock frequency in comparison with a single line (simplex line), to achieve double the signal bandwidth. The characteristic feature of a duplex line resides in the fact that identical stages of both lines are each controlled by one of the two clock signals, i.e., the stage $n$ of the one line by the clock signal $\phi_1$ and the identical stage of the other line by the clock signal $\phi_2$. This is indicated in the schematical circuit diagram shown in FIG. 6, in that the clock signal lines extending to the line portions $VL_1$, $VL_2$ or $VL_1'$, $VL_2'$ are crossed between the parts $VL_1$, $VL_2$ or $VL_1'$, $VL_2'$ belonging to the one half.

The corresponding inverter stages $I_1$ and $I_1'$ are again inserted in the center of the respective half after $n/2$ stages, as in the example of embodiment according to FIG. 2, imagining that the gates of the load transistors are again capable of being controlled by a correspondingly variable voltage $U_{c1} + \Delta U_{c1}$ or $U_{c1}' + \Delta U_{c1}'$, that the front portions are correspondingly terminated at the oscillating point and that the rear portions are controlled via a stage $T_{01}$, $C_{01}$.

The further inverter amplifier $I_2$ or $I_2'$ according to FIG. 2 is again provided for at each of the outputs of the two duplex line halves, with the gain factor thereof likewise capable of being adjusted via the voltages $U_{c2} + \Delta U_{c2}$ or $U_{c2}' + \Delta U_{c2}'$. The two impedance converter stages $T_A$, $T_A'$ are connected as an adder circuit to the output of the two amplifiers $I_2$, $I_2'$, with the outputs thereof extending to the common signal output $u_A$. Moreover, by the two amplifiers $I_2$, $I_2'$ and the adjustable gain factors thereof, it is possible to achieve an optimum clock suppression in the output signal.

In the embodiments shown in FIGS. 1, 2, 5 and 6, the transistors are indicated as being integrated insulated-gate field-effect transistors and, by the omission of the substrate arrow, it is indicated that, in the general case, either only p-channel or only n-channel transistors are used. Instead of integrated insulated-gate field-effect transistors, of course, it is also possible to use bipolar transistors.

Instead of the shown inverter stages it is also possible to use differential amplifiers connected to operate as inverter stages, in which case a suitable potential must be applied to the one input thereof.

By the invention it is thus possible to compensate for the clock-frequency dependent modulations of delay lines by involving low expenditure. In particular, it is not necessary to provide for a second delay line for balancing the disturbed signal as is still being taught by the present state of the art.

While the principles of the invention have been described above in connection with specific apparatus, it is to be clearly understood that this description is made only by way of example and not as a limitation on the scope of the invention.

What is claimed is:

1. A delay line of the type wherein a plurality of stages are coupled together, said delay line having an input to which there is applied a d.c. potential and a signal to be delayed and wherein clock signals are applied to said stages, comprising:

at least one inverter stage coupled between two adjacent stages of said plurality of stages for inverting the signal potential; and means for adding the output of said at least one inverter stage to said delay line thereby reducing unwanted modulations with respect to said d.c. input potential.

2. A delay line according to claim 1 wherein said delay line comprises $n$ stages, where $n$ is an even number, and wherein said at least one inverter is coupled between stage $n/2$ and stage $(n/2) + 1$.

3. A delay line according to claim 1 wherein said dealy line comprises $n$ stages, and $k$ inverter stages are inserted, the first after the $(n/2k)$th stage, and the remaining inverters inserted at spaced intervals of approximately $n/k$ stages.

4. A delay line according to claim 1 wherein said at least one inverter stage is inserted between the first and second stages of said plurality of stages.

5. A delay line according to claim 1 wherein said at least one inverter stage comprises an amplifier having an adjustable gain factor.

6. A delay line according to claim 1 wherein said delay line is terminated at a junction point between said at least one inverter stage and the respective preceding delay line stage, as well as being terminated at its end.

7. A delay line according to claim 1 further comprising an inverting amplifier having an adjustable gain factor coupled to the output thereof.

8. A delay line according to claim 1 further comprising a non-inverting amplifier having an adjustable gain factor coupled to the output thereof.

9. A delay line according to claim 1 wherein said at least inverter stage comprises a differential amplifier.

* * * * *